(12) United States Patent
Amiotti et al.

(10) Patent No.: US 8,453,892 B2
(45) Date of Patent: Jun. 4, 2013

(54) METHOD AND SYSTEM FOR THE CONTROLLED DISPENSING OF MERCURY AND DEVICES MANUFACTURED THROUGH THIS METHOD

(75) Inventors: Marco Amiotti, Cornaredo (IT); Giorgio Longoni, Monza (IT); Antonio Bonucci, Milan (IT); Alessio Corazza, Como (IT)

(73) Assignee: Saes Getters S.p.A., Lainate (MI) (IT)

( * ) Notice: Subject to any disclaimer, the term of this patent is extended or adjusted under 35 U.S.C. 154(b) by 0 days.

(21) Appl. No.: 13/265,840

(22) PCT Filed: Feb. 15, 2011

(86) PCT No.: PCT/EP2011/052236
§ 371 (c)(1),
(2), (4) Date: Oct. 21, 2011

(87) PCT Pub. No.: WO2011/104145
PCT Pub. Date: Sep. 1, 2011

(65) Prior Publication Data
US 2012/0100281 A1    Apr. 26, 2012

(30) Foreign Application Priority Data
Feb. 23, 2010 (IT) .............................. MI2010A0285

(51) Int. Cl.
*H01J 61/24* (2006.01)
(52) U.S. Cl.
USPC ......................................... 222/590; 222/594
(58) Field of Classification Search
USPC .................................................. 222/590, 594
See application file for complete search history.

(56) References Cited

U.S. PATENT DOCUMENTS

| | | | |
|---|---|---|---|
| 3,203,901 A | 8/1965 | Porta et al. | |
| 3,657,589 A | 4/1972 | Porta et al. | |
| 3,733,194 A * | 5/1973 | Porta et al. | ...... 75/255 |
| 5,714,391 A | 2/1998 | Omura et al. | |
| 5,825,127 A | 10/1998 | Weinhardt | |
| 5,846,319 A | 12/1998 | Barton | ............. 117/60 |
| 6,537,845 B1 | 3/2003 | McCandless et al. | |
| 6,680,571 B1 * | 1/2004 | Giorgi et al. | ................... 313/565 |
| 7,026,228 B1 | 4/2006 | Hails et al. | ..................... 438/509 |
| 7,052,649 B2 * | 5/2006 | Grossman et al. | ................ 422/4 |
| 2009/0258457 A1 | 10/2009 | Britt et al. | |

FOREIGN PATENT DOCUMENTS

| | | |
|---|---|---|
| EP | 0505249 | 3/1992 |
| EP | 0669639 | 8/1995 |
| EP | 0683919 | 11/1995 |
| EP | 0691670 | 1/1996 |
| EP | 0737995 | 10/1996 |
| GB | 2056490 | 3/1981 |

(Continued)

OTHER PUBLICATIONS

Written Opinion for PCT/EP2011/052236 filed on Feb. 15, 2011, in the name of SAES GETTERS S.P.A.

(Continued)

*Primary Examiner* — Scott Kastler
(74) *Attorney, Agent, or Firm* — Steinfl & Bruno LLP

(57) ABSTRACT

A method for a controlled dispensing of mercury by mercury sources that release mercury at a temperature Te, the sources being kept at a conditioning temperature Tc<Te and being brought to a temperature T>Te by means of displacement of the mercury sources.

21 Claims, 2 Drawing Sheets

FOREIGN PATENT DOCUMENTS

Figure 1:
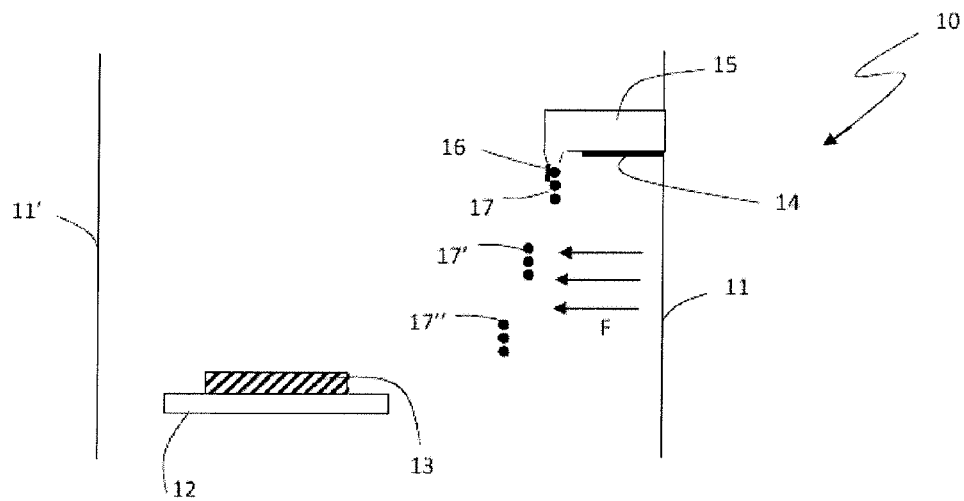

| | | |
|---|---|---|
| JP | 63174312 | 7/1988 |
| JP | 04091442 | 3/1992 |
| JP | 04310594 | 11/1992 |
| JP | 04083793 | 3/1993 |
| JP | 06217911 | 8/1993 |
| JP | 06283103 | 10/1997 |
| JP | 04287312 | 10/2004 |
| JP | 2012-516801 | 7/2012 |
| WO | 94/18692 | 8/1994 |
| WO | 98/53479 | 11/1998 |
| WO | 2006/008771 | 1/2006 |

OTHER PUBLICATIONS

International Search Report for PCT/EP2011/052236 filed on Feb. 15, 2011, in the name of SAES GETTERS S.P.A.

N. Romeo, et al. "HgCdTe Thin Films for Solar Cells Application Prepared by Multisource Evaporation", Thin Solid Films, vol. 157, No. 2, pp. 175-180, Feb. 29, 1988.

Kumaresan, R., et al., Novel 'Photochemical deposition' and conventional 'Electrochemical deposition' of CdS and $Hg_xCd_{1-x}Te$ thin films and their characterization for solar cell device applications, Mat. Res. Soc. Symp. Proc. 2001, 668: H1.9.1—6.

Symko-Davies, M., Progress in High-Performance PV: Polycrystalline Thin-Film Tandem Cells, Aug. 2004 Conference Paper—NREL, NREL/CP-520-35174, 9 pages.

Notice of Reasons for Rejection mailed on May 29, 2012 for Japanese Application No. 2012-516801 filed on Feb. 3, 2009.

Decision of Rejection mailed on Nov. 27, 2012 for Japanese Application No. 2012-516801 filed on Feb. 3, 2009 (English + Japanese).

* cited by examiner

METHOD AND SYSTEM FOR THE CONTROLLED DISPENSING OF MERCURY AND DEVICES MANUFACTURED THROUGH THIS METHOD

CROSS REFERENCE TO RELATED APPLICATIONS

This application is in the US National Stage application of PCT/EP2011/052236, filed on Feb. 15, 2011, which in turn, claims priority to Italian Patent Application No. MI2010A000285 filed on Feb. 23, 2010.

The present invention relates to a method for the controlled dispensing of mercury and to a system therefor, as well as to devices manufactured through this method.

Regardless of the constraints due to environmental impact, the use of mercury, is anyway necessary for the correct operation of some devices.

In particular, one of the most important applications is in discharge lamps for lighting. In this case, when mercury is dosed by using dispensers based on compounds containing mercury, the technical problems to be solved are to avoid mercury loss at low temperature during the first steps of lamp processing, then dispensing mercury in a gaseous form only at high temperatures (above 500° C.), to maximize the yield and to cause the mercury release to occur in very short times. The first two constraints are due to environmental considerations, while the third one is due to industrial considerations relating to the yield and the duration of the manufacturing process of each lamp.

A very effective solution for the mercury release is described in the international patent application WO 98/53479, in the applicant's name. In this case a mercury dispenser may be integrated in the lamp or employed in a phase of the manufacturing process and may be eliminated during the sealing of the lamp.

Another very interesting solution for dispensing mercury is described in U.S. Pat. No. 5,825,127 and in the international application WO 9719461, the latter being in the applicant's name. In this case strips coated with some particular compounds of mercury and getter material are used to form metal rings, which also carry out the function of a shield within the lamp. Also in these types of devices it is required to maximize the release of mercury in very short times.

Still in the field of the solutions characterised by a dosage that is discrete and not controlled over time, also patent EP 0683919 has to be mentioned, which discloses the use of spherules or granules of zinc-mercury having a mercury concentration gradient that is poorly present in the external portion of the granule.

Parallel to these applications, there are other applications requiring a controlled dispensing over time of an amount of mercury in order to create a film of mercury or of other materials doped with precise amounts of mercury. These devices are typically manufactured on supports arranged in suitable sealed manufacturing chambers, wherein gases, that are typically purified, flow. These gases are often heated and may carry out a double function, i.e. transporting chemical substances needed for the manufacturing of the device, last but not least the transportation of mercury vapors, or removing undesired substances, e.g. deriving from the decomposition of precursors of the elements or the chemical substances used in the manufacturing of the device.

Other alternative manufacturing methods employ deposition processes that are typical in the semiconductor industry, i.e. processes of thermal evaporation or of erosion by means of plasma in vacuum chambers.

Among the most interesting applications there are mercury-cadmium-tellurium solar cells and IR sensors. The interest associated with the use of the ternary compound HgCdTe is due to the fact that this compound has an absorption band that can be perfectly centered on the infrared portion of the interested electromagnetic spectrum by suitably varying the concentration of mercury. Therefore, this compound is the best solution for all the thin-film IR sensors used in several applications, from consumer electronic products to microelectronics, as well as for sophisticated scientific and military apparatuses.

The ternary compound HgCdTe is very interesting also in the field of thin-film solar cells. The mostly diffused solar cells are based on the compound CdTe coupled with cadmium sulphide, CdS, and achieve maximum yields of about 10-11% in mass production. The combination CdTe/CdS allows to have an optimum absorption of the spectrum for those wavelengths falling in the visible range and in the near ultraviolet range (1.3-1.5 eV). The use of HgCdTe/CdS cells improves the electrical parameters with particular reference to yield or other parameters characterizing the device (see Kumaresan, Mat. Res. Soc. Symp. Proc. Vol. 668). The addition of a layer of HgCdTe to the combination CdTe/CdS allows to maximize the efficiency by expanding the absorption and conversion band of the spectrum also in the IR range from 1.0 to 1.2 eV (see Martha Symko-Davies, Progress in High-Performance PV: Polycrystalline Thin-Film Tandem Cells, NREL/CP-520-35174, August 2004).

One of the problems related to these applications is the correct management of mercury evaporation. In particular, if the mercury dispensing compounds are used jointly in a single crucible with the other compounds to be evaporated, there are problems of lack of homogeneity linked to both the concentration gradient established over time, and to the need for a much more precise control of the temperature due to the strong variability of the mercury release rate depending on the temperature.

The use of temperature controlled sources arranged proximate to the support on which the mercury doping has to be carried out is described, for example, in U.S. Pat. No. 7,026,228. In this type of solutions the correct design of the system, as well as the coupling between the mercury releasing material and the dispensing system is particularly critical. A solution providing for the use of liquid mercury in fact cannot be used, because the temperature proximate to the support is very high (more than 400° C.), and therefore not compatible with mercury in the liquid state. On the contrary, the use of other compounds for the mercury release requires a particular coupling between the structure of the dispenser and the type of material. This coupling often results in solutions tied to the specific machine or process employed.

The use of solutions containing the metal to be dispensed is instead described in US 2009/0258457, wherein typically a salt of the metal is subsequently dissolved in a suitable solvent. This solution is particularly complex and requires additional manufacturing steps for the removal of non-necessary components, such as solvent and complexing agent.

Similarly, U.S. Pat. No. 6,537,845 describes a deposition process wherein a liquid film is formed on the substrate. In this case six manufacturing steps are necessary to achieve the final consolidation of the film having the desired properties, while the use of metal-organic compounds is described in U.S. Pat. No. 5,714,391.

All these technical solutions have the drawback of requiring manufacturing steps that are tied to a particular manufacturing process or to the use of particular substances characterised by remarkable handling problems, and in some cases these technical solutions have both these drawbacks.

It is an object of the present invention to overcome the drawbacks still present in the prior art, and in particular to obtain a mercury release that is controlled over time without resorting to the use of solutions linked to the process type or requiring additional manufacturing operations. In a first aspect thereof, the invention consists in a method for dispensing mercury in a controlled way over time by using sources that release mercury at a temperature Te, characterized in that said sources are kept at a conditioning temperature Tc<Te and brought to a temperature T>Te by means of displacement said sources.

Figure 2:
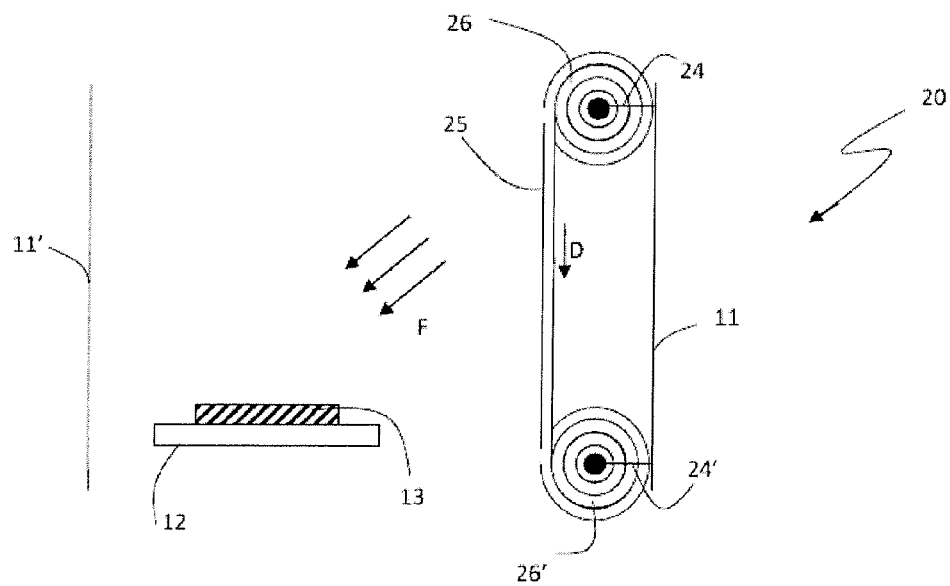
Figure 3:
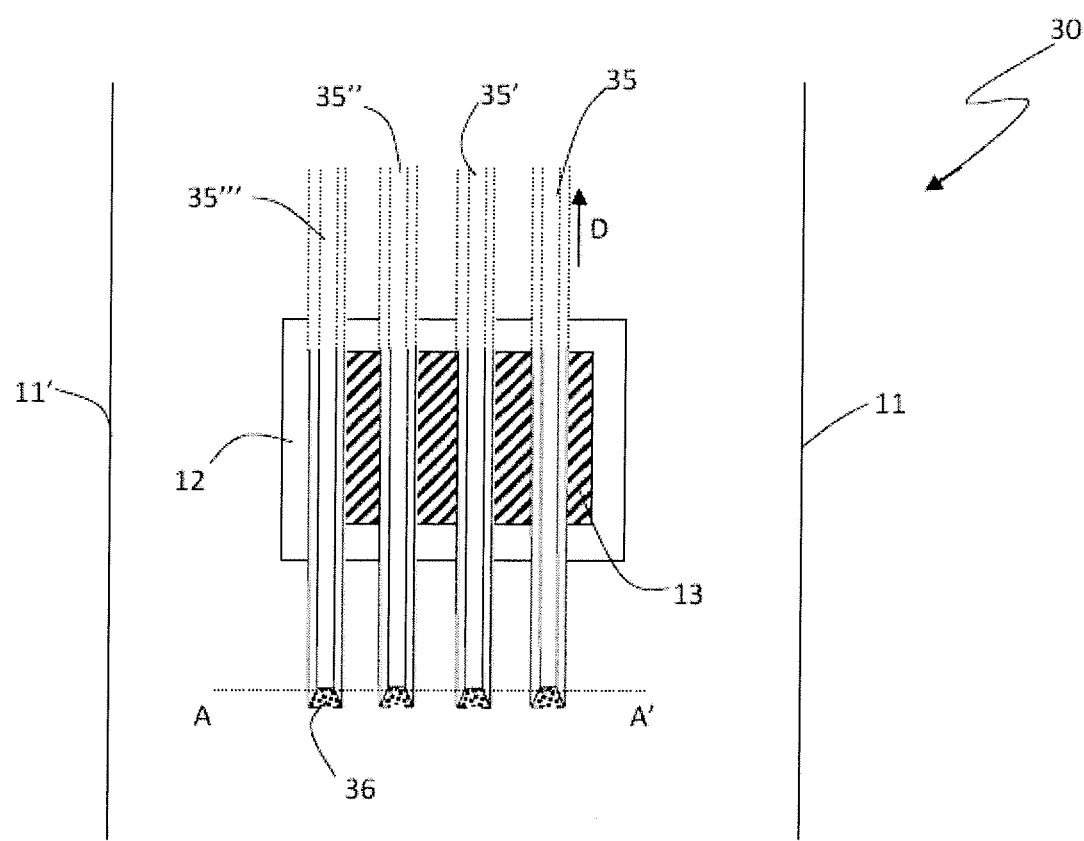

The invention will be illustrated with reference to the following drawings, wherein:

FIG. 1 schematically shows a front view of a process chamber wherein the process of the present invention is used in a first embodiment thereof;

FIG. 2 schematically shows a front view of a process chamber wherein the process of the present invention is used in a second embodiment thereof; and FIG. 3 schematically shows a top view of a process chamber of a preferred variant of the second embodiment.

In these figures, the size and the dimensional ratios between the members may not be correct, with particular and non-exclusive reference to the size of the continuous dispensers having a filiform shape of FIG. 3, where the size and dimensional ratios have been altered in order to improve the legibility of the drawings. Moreover, some members that are not essential to the present invention, with particular and non-exclusive reference to the means for controlling the flow of gas or to the means for moving and winding the continuous dispensers having a filiform shape of FIG. 3, have not been shown.

In a preferred embodiment the difference of temperature between Tc and Te is lower than 100° C. This allows to have of a rapid release of mercury proximate to the location where this is used and also eliminates one of the inconveniences occurring when there is a mercury source dispensing mercury not proximate to a location where this is necessary. These inconveniences relate to a possible buildup and related contamination in correspondence to cold areas of the process chamber, e.g. ducts or walls that are not optimally been thermoregulated.

Among the mercury sources useful for the manufacturing of the invention there are sources both in a discrete and in a continuous form.

In particular, the sources in a discrete form may be granules or spheres made of mercury amalgams as disclosed e.g. in patent EP 0683919 or pills made of a dispensing material, i.e. containing mercury. In this case, the discrete sources are arranged in a container that is provided with means for dispensing them in a controlled way in order to adjust the frequency over time, e.g. provided with an aperture having a shutter. In an alternative embodiment the discrete sources are in the form of precisely dosed droplets.

The container is arranged in the process chamber to be used for the manufacturing of a film doped with mercury or, more generally, of a device requiring a controlled dosage of mercury, at a higher level than the support, so that discrete dispensers carry out the transition between temperatures Tc and Te and therefore release mercury while falling down.

It is clear that the discrete sources are not aligned with respect to the support in the vertical direction in order to prevent them from falling thereon.

The container may be positioned in correspondence to a portion of the process chamber that is at a temperature Tc, or it may be arranged in a portion of the chamber that is at a lower temperature while providing for means for heating and controlling.

The discrete sources may be ejected at a constant frequency or also in cadenced groups or in "packages", which occurs when a significant amount of mercury must be dispensed and there is no intention to increase the size of the discrete source in order to avoid possible non-uniform conditions due to the presence of thermal profiles in the source itself.

This embodiment is depicted in FIG. 1, which shows a portion of the process chamber 10 in a front view. The process chamber has side walls 11, 11' that are generally kept at a high temperature (typically higher than 400° C.). In the process chamber there is a support 12 on which a film 13 made of mercury or that needs to be doped with mercury is caused to grow.

In the process chamber a flow F of a purified gas is typically made to flow. Preferably, the gases flow is at a temperature proximate to the conditioning temperature Tc. The means for purifying and controlling the gaseous flow have not been represented, the drawing just showing a possible direction of this gaseous flow inside the process chamber. It is clear that the direction of the gaseous flow must be such to carry the mercury vapors towards the support.

On one of the chamber walls there is a support 14 of a container 15 containing mercury sources 17, 17', 17" in a discrete form. The container has a suitable mechanism for ejecting the discrete sources of mercury in a controlled way over time, the mechanism being schematically shown in FIG. 1 as element 16 and having the form of a shutter in an open position.

FIG. 1 shows an example of a possible way to use the mercury sources according to the present invention, but many variants achieving the same purpose in an equivalent way are possible. The container 15 may e.g. be fixed directly to the wall 11.

In addition to the main function, which is related to the release of mercury, the discrete sources may carry out a secondary function of removing gaseous contaminants by introducing one or more non-evaporable getter members. This type of solution is preferred when the discrete source is in the form of pills.

In this case the presence of a getter material also acts as a ballast, thus ensuring a certain uniformity in the falling speed of the discrete member for the mercury release.

Suitable materials for dispensing mercury inside discrete sources are preferably made of the compounds disclosed in U.S. Pat. No. 3,657,589, i.e. compounds $Ti_xZr_yHg_z$ wherein x and y vary between 0 and 13 under the condition that their sum is comprised between 3 and 13 and that z is 1 or 2. Particularly preferred is the use of $Ti_3Hg$. These compounds may also be used in combination with promoters that maximize the release of mercury, thus ensuring a rapid release when the discrete device crosses the region at a temperature T>Te. These promoters are made of copper together with at least one second element chosen among tin, indium and silver, as disclosed in patent EP 0669639, or copper and silicon, as disclosed in patent EP 0691670, or copper, tin and rare earths, as disclosed in patent EP 0737995.

The temperature Te is generally not lower than 700° C.

Alternatively, mercury dispensing compounds may be used comprising a weight percentage of titanium comprised between 10% and 42%, a weight percentage of copper comprised between 14% and 50%, a weight percentage of mercury comprised between 20% and 50% and a weight percentage comprised between 1% and 20% of one or more among tin, chromium and silicon, as disclosed in the international patent publication WO 2006/008771, or ternary compounds titanium-copper-mercury, as the compounds disclosed in patent GB 2056490. These mercury dispensing materials may be used in the form of granules or pills in the first embodiment of the invention, but they are the preferred ones for the use in the second embodiment.

The use of zinc-mercury amalgams is instead preferred in the embodiment providing for the use of spherules or droplets. This type of solution is preferred in process chambers operating at a relatively low temperature or having portions at a low temperature wherein the container can be arranged.

Getter materials to be considered useful in addition to the materials for releasing mercury may be, for example, a Zr—Al alloy at 16% by weight of aluminum, disclosed in U.S. Pat. No. 3,203,901, or an alloy Zr—Co-MM, wherein MM indicates Y, La, Ce, Pr, Nd, rare earths metals or mixtures of these elements, comprising about 80% by weight of zirconium, 15% by weight of cobalt and rest being MM.

In a second embodiment thereof, the method according to the present invention provides for the use of mercury sources in a continuous form, e.g. strips of material for dispensing mercury deposited on a ribbon in the form of a wound reel. In this case the reel is unwound and the ribbon is made to run proximate to the device requiring mercury.

Also in this case the reel may be brought at temperature Tc either by a suitable arrangement inside the process chamber or by using heating means.

The use in the form of a ribbon is particularly advantageous when a getter material is present on the ribbon. In this case in fact the getter material can remove the gaseous impurities for a longer time and carries out its function "continuously".

Another advantage provided by the method according to the present invention is that in the case of an interruption of the process, the release of mercury can be rapidly interrupted; in the case of discrete sources this can be achieved by interrupting the ejection from the container, while in the case of a continuous ribbon, this can be done by blocking the run of the ribbon.

In the latter case, when restarting the process, it is also advantageous to rewind a part of the ribbon in order to use the portion of the ribbon that has been subject to a partial evaporation of mercury for an initial conditioning of the process.

It is also possible to operate the ribbon by making it to carry out discrete steps instead of a continuous run, but this solution is less preferred.

The embodiment of the method wherein the mercury source is in a continuous form, i.e. wherein the mercury dispensing material is arranged on a ribbon, is depicted in FIG. 2, which shows a front view of a process chamber 20. In this case there is a mercury source 25 in the form of a ribbon, which is made to run in a direction indicated by an arrow D. The ribbon is wound on two reels 26, 26', at least one of which is provided with ribbon moving systems (not shown). The reels are restrained to a wall of the chamber by means of supports 24, 24'.

In this type of embodiment the preferred direction for the gaseous flow F is oblique.

In the ribbon embodiment the mercury releasing materials, and the possibly present getter materials, are typically used in the form of powders and may be caused to adhere to the ribbon by the so-called cold-rolling process. The preferred grain size of the powders is lower than 250 µm.

The deposit of these materials is typically in the form of a single strip on a ribbon of a small size (in this case the getter material may be deposited on the opposite face of the ribbon) or parallel strips having a width comprised between 2 and 6 mm and spaced apart by 1 mm, applied on a face of a ribbon having a larger size. These deposits have not been shown in the drawing in order not to compromise its legibility.

Various metallic materials may be used to manufacture the ribbon, among which preferred is the use of nickel-plated iron. Materials that do not release gases when subjected to thermal processes may also be used, such as the materials employed or compatible with vacuum systems, e.g. AISI 304 steel.

A variant of the embodiment in the continuous form is shown in FIG. 3, depicting a top view of a portion of the process chamber. In this case, the use of one or more filiform elements having an indefinite length is foreseen, the filiform elements containing powders of a mercury dispensing material and, optionally powders of getter materials. These filiform elements have a slit on one side and are disclosed in patent application WO 98/53479, whose teachings as to the features of the manufacturing process are herewith incorporated by reference. Similarly to what has been described with reference to FIG. 2, each filiform element 35, 35', 35", 35''', is wound on a reel (not shown) kept at temperature Tc. The portion of the filiform element is moved by pulling and when it arrives proximate to the support it reaches temperature Te. The direction D shown in the drawing indicates the pulling direction of the continuous filiform dispensers.

In this case a slit 36 present in each one of the various filiform elements faces the support 12. The transition between Tc and Te may advantageously occur by means of a flow (not shown) of a pure gas at a high temperature striking the support 12 from the top.

The cross-section A-A' of the filiform elements shows in particular the preferred cross section of these elements, that is trapezoidal, and the presence of the slit 36 for dispensing Hg vapors. In a variant, the slit does not face the support but faces the opposite direction. This type of expedient allows to minimize possible contamination phenomena, should particles fall from the filiform dispensing elements.

Comparing it to the ribbon embodiment shown in FIG. 2, this alternative embodiment of the continuous source has the advantage to create mercury sources of a laminar type and to ensure a uniform dispersion on the support by means of a gas flow. Moreover, in this case the mercury release occurs only in the close proximity of the support, thus minimizing the risk of contamination of the process chamber. This type of solution is particularly advantageous when the release of mercury must be carried out in a uniform way on devices having a large surface area. In addition, by suitably adjusting the load of the filiform element with a higher or lower amount of mercury, or by employing filiform elements having different diameters, it is possible to adequately create mercury concentration profiles in the device.

In a further embodiment filiform elements arranged perpendicularly to each other on two planes may also be used, thus obtaining a mercury dispensing grid.

In this embodiment mercury releasing materials and getter materials are used in the form of powders and are the same materials as those of the ribbon embodiment. Similarly, nickel-plated iron is the preferred material for the manufacturing of the ribbon that encloses the powders except for the slit allowing to release mercury.

In a second aspect thereof the invention relates to a system for the dispensing of mercury comprising a plurality of discrete sources in the form of pills or spherical granules and means for ejecting said mercury discrete sources in a controlled way over time.

In a preferred embodiment this system comprises means for controlling and adjusting the temperature of the system at a conditioning temperature Tc, lower than the temperature of mercury release from the discrete sources contained in the system.

In a third aspect thereof the invention relates to devices manufactured according to methods described herein.

In this case among the most interesting devices there are mercury-cadmium-tellurium solar cells and IR radiation detection devices.

The invention claimed is:

1. A method for time controlled dispensing of mercury by mercury sources that release mercury at a temperature Te, the method comprising:
    keeping the mercury sources at a conditioning temperature Tc, wherein Tc<Te and the difference between Tc and Te is equal to or less than 100° C., and
    bringing the sources to a temperature T>Te by displacing the sources.

2. The method according to claim 1, wherein the mercury sources are in a discrete form.

3. The method according to claim 2, wherein the mercury sources in the discrete form further comprise getter materials.

4. The method according to claim 2, wherein the mercury sources in the discrete form are in a form selected from the group consisting of granules, droplets, or pills of compressed powders.

5. The method according to claim 2, further comprising ejecting the mercury sources in the discrete form from a container at constant frequency or in cadenced groups.

6. The method according to claim 1, wherein the mercury sources are in a continuous form.

7. The method according to claim 6, wherein the mercury sources in the continuous form are in a form of a metallic ribbon on which a mercury dispensing material is deposited to provide deposits of the mercury dispensing material.

8. The method according to claim 7, wherein the deposits are in a form of tracks of compressed powders.

9. The method according to claim 7, wherein the metallic ribbon further comprises deposits of getter materials.

10. The method according to claim 6, wherein the mercury sources in the continuous form are in a form of filiform elements comprising powders of mercury dispensing materials.

11. The method according to claim 10, wherein in the filiform elements further comprise getter materials powders.

12. The method according to claim 10, wherein the filiform elements comprise two series of filiform elements, orthogonal to each other.

13. The method according to claim 10, wherein each filiform element presents a different level of mercury loading.

14. The method according to claim 11, wherein the filiform elements comprise two series of filiform elements orthogonal to each other.

15. The method according to any of claim 11, wherein each filiform element presents a different level of mercury loading.

16. The method according to claim 12, wherein each filiform element presents a different level of mercury loading.

17. A method for time controlled dispensing of mercury by mercury sources that release mercury at a temperature Te, the method comprising:
    keeping the mercury sources at a conditioning temperature Tc, wherein Tc<Te, and
    bringing the sources to a temperature T>Te by displacing the sources, wherein:
    the mercury sources are in a continuous form, the continuous form corresponding to a form of filiform elements comprising powders of mercury dispensing materials, and
    the filiform elements comprise two series of filiform elements, orthogonal to each other.

18. A method for time controlled dispensing of mercury by mercury sources that release mercury at a temperature Te, the method comprising:
    keeping the mercury sources at a conditioning temperature Tc, wherein Tc<Te, and
    bringing the sources to a temperature T>Te by displacing the sources, wherein:
    the mercury sources are in a continuous form, the continuous form corresponding to a form of filiform elements comprising powders of mercury dispensing materials, and
    each filiform element presents a different level of mercury loading.

19. A method for time controlled dispensing of mercury by mercury sources that release mercury at a temperature Te, the method comprising:
    keeping the mercury sources at a conditioning temperature Tc, wherein Tc<Te, and
    bringing the sources to a temperature T>Te by displacing the sources, wherein:
        the mercury sources are in a continuous form, the continuous form corresponding to a form of filiform elements comprising powders of mercury dispensing materials and getter materials powders, and
        the filiform elements comprises two series of filiform elements orthogonal to each other.

20. A method for time controlled dispensing of mercury by mercury sources that release mercury at a temperature Te, the method comprising:
    keeping the mercury sources at a conditioning temperature Tc, wherein Tc<Te, and
    bringing the sources to a temperature T>Te by displacing the sources, wherein:
    the mercury sources are in a continuous form, the continuous form corresponding to are in a form of filiform elements comprising powders of mercury dispensing materials and getter materials powders, and
    each filiform element presents a different level of mercury loading.

21. The method according to claim 17, wherein each filiform element presents a different level of mercury loading.

* * * * *